(12) United States Patent
Kuwabara

(10) Patent No.: US 9,577,310 B2
(45) Date of Patent: Feb. 21, 2017

(54) SEMICONDUCTOR PACKAGE AND SEMICONDUCTOR PACKAGE MOUNTING STRUCTURE

(71) Applicant: NEC Corporation, Tokyo (JP)

(72) Inventor: Toshihide Kuwabara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/438,734

(22) PCT Filed: Jun. 25, 2013

(86) PCT No.: PCT/JP2013/003956
§ 371 (c)(1),
(2) Date: Apr. 27, 2015

(87) PCT Pub. No.: WO2014/068811
PCT Pub. Date: May 8, 2014

(65) Prior Publication Data
US 2015/0311576 A1    Oct. 29, 2015

(30) Foreign Application Priority Data
Nov. 2, 2012 (JP) .................. 2012-242580

(51) Int. Cl.
*H01L 23/66* (2006.01)
*H01L 23/64* (2006.01)
(Continued)

(52) U.S. Cl.
CPC ............. *H01P 5/107* (2013.01); *H01L 23/043* (2013.01); *H01L 23/12* (2013.01);
(Continued)

(58) Field of Classification Search
CPC .................................. H01P 5/107; H01L 23/66
(Continued)

(56) References Cited

U.S. PATENT DOCUMENTS 3,579,149 A * 5/1971 Ramsey ................. H01P 5/107
333/21 R
4,716,386 A   12/1987 Lait
(Continued)

FOREIGN PATENT DOCUMENTS

EP      0249310 A1   12/1987
JP      6-132708 A    5/1994
(Continued)

OTHER PUBLICATIONS

Bhat et al. "Stripline-like Transmission lines for microwave integrated circuits", New Age International, 1989.*
(Continued)

*Primary Examiner* — Andy Huynh
*Assistant Examiner* — Sitaramarao S Yechuri
(74) *Attorney, Agent, or Firm* — Wilmer Cutler Pickering Hale and Dorr LLP

(57) ABSTRACT

A semiconductor package mounting structure includes a substrate (200) and a semiconductor package (100). The substrate (200) includes an opening (210) connected to a cavity of a waveguide (310). The semiconductor package (100) is mounted on the substrate (200). The semiconductor package (100) includes a semiconductor device (110) and a probe (152) connected to the semiconductor device (110). The opening (210) includes a part that overlaps the probe (152) and a part that does not overlap the semiconductor package (100).

3 Claims, 8 Drawing Sheets

(51) Int. Cl.
*H01P 5/107* (2006.01)
*H01L 23/12* (2006.01)
*H01L 23/043* (2006.01)
*H01L 23/498* (2006.01)
*H01L 23/00* (2006.01)

(52) U.S. Cl.
CPC .. *H01L 23/49822* (2013.01); *H01L 23/49838* (2013.01); *H01L 23/66* (2013.01); *H01L 24/48* (2013.01); *H01L 2223/6627* (2013.01); *H01L 2224/48091* (2013.01); *H01L 2224/48227* (2013.01); *H01L 2924/1423* (2013.01); *H01L 2924/15156* (2013.01)

(58) Field of Classification Search
USPC .................................. 257/664, 728; 333/26
See application file for complete search history.

(56) References Cited

U.S. PATENT DOCUMENTS

| | | | | |
|---|---|---|---|---|
| 5,808,519 | A * | 9/1998 | Gotoh | H01L 23/66 333/247 |
| 5,982,250 | A * | 11/1999 | Hung | H01L 23/49822 257/E23.062 |
| 6,333,856 | B1 * | 12/2001 | Harju | H01L 23/13 257/723 |
| 2003/0197573 | A1 | 10/2003 | Kato | |
| 2005/0122255 | A1 | 6/2005 | Shmuel | |
| 2006/0001503 | A1 * | 1/2006 | Stoneham | H01P 5/107 333/26 |
| 2007/0026567 | A1 * | 2/2007 | Beer | G01S 7/032 438/106 |
| 2008/0111654 | A1 | 5/2008 | Rivas et al. | |
| 2010/0038775 | A1 | 2/2010 | Camiade et al. | |
| 2010/0308942 | A1 | 12/2010 | Shmuel | |
| 2011/0057741 | A1 * | 3/2011 | Dayan | H01P 5/107 333/26 |
| 2012/0051000 | A1 | 3/2012 | Laidig et al. | |
| 2013/0256849 | A1 * | 10/2013 | Danny | H01L 23/66 257/664 |
| 2014/0183710 | A1 | 7/2014 | Laidig et al. | |
| 2016/0050793 | A1 | 2/2016 | Laidig et al. | |

FOREIGN PATENT DOCUMENTS

| | | |
|---|---|---|
| JP | 11-243307 A | 9/1999 |
| JP | 11-340414 A | 12/1999 |
| JP | 2001-267814 A | 9/2001 |
| JP | 2003-309404 A | 10/2003 |
| JP | 2008-524887 A | 7/2008 |
| JP | 2010-098609 A | 4/2010 |
| WO | WO-2006/059929 A1 | 6/2006 |

OTHER PUBLICATIONS

International Search Report corresponding to PCT/JP2013/003956 mailed Aug. 27, 2013 (2 pages).

Extended European Search Report issued by the European Patent Office for Application No. 13850263.8 dated May 24, 2016 (9 pages).

* cited by examiner

SEMICONDUCTOR PACKAGE AND SEMICONDUCTOR PACKAGE MOUNTING STRUCTURE

CROSS-REFERENCE TO RELATED APPLICATIONS

This application is a national stage application of International Application No. PCT/JP2013/003956 entitled "Semiconductor Package and Semiconductor Package Mounting Structure," filed on Jun. 25, 2013, which claims the benefit of the priority of Japanese Patent Application No. 2012-242580, filed on Nov. 2, 2012, the disclosures of each of which are hereby incorporated by reference in their entirety.

TECHNICAL FIELD

The present invention relates to a semiconductor package and a semiconductor package mounting structure, and more particularly, to a semiconductor package and a semiconductor package mounting structure suitable for dealing with high-frequency signals.

BACKGROUND ART

Patent literature 1 discloses a millimeter wave Low Temperature Co-fired Ceramics (LTCC) package. The LTCC package includes a dielectric layer, a probe formed on the dielectric layer, and a monolithic microwave integrated circuit (MMIC). The probe is connected to a pad of the MMIC via a microstrip. The dielectric layer covers the whole part of an opening part of a waveguide.

Patent literature 2 discloses a microwave integrated circuit multi-chip module. This module includes a package substrate formed of a material having a dielectric property and a plurality of MMICs mounted on the package substrate. The package substrate includes a blind rectangular cavity opened in its back surface. The rectangular cavity does not reach the front surface of the package substrate. The package substrate also has a microstrip antenna provided at a position corresponding to the rectangular cavity on the front surface of the package substrate. The package substrate includes a plurality of through via holes around the rectangular cavity. The rectangular cavity and the plurality of through via holes constitute a waveguide part.

CITATION LIST

Patent Literature

Patent literature 1: Japanese Unexamined Patent Application Publication No. 11-243307
Patent literature 2: Japanese Unexamined Patent Application Publication No. 11-340414

SUMMARY OF INVENTION

Technical Problem

When the waveguide is blocked by the dielectric as stated above, a discontinuous point is formed in a transmission line of high-frequency signals if the relative dielectric constant of the dielectric is large. There is a problem that transmission properties of the high-frequency signals are degraded due to the presence of the discontinuous point.

The present invention has been made to solve such a problem, and aims to provide a semiconductor package and a semiconductor package mounting structure having good transmission properties of high-frequency signals.

Solution to Problem

A semiconductor package mounting structure according to a first exemplary aspect of the present invention includes a substrate in which an opening connected to a cavity of a waveguide is formed, and a semiconductor package mounted on the substrate. The semiconductor package includes a semiconductor device, and a probe connected to the semiconductor device. The opening includes a part that overlaps the probe and a part that does not overlap the semiconductor package.

A semiconductor package according to a second exemplary aspect of the present invention includes a semiconductor device and a multi-layered substrate. The multi-layered substrate includes a device mounted part on which the semiconductor device is mounted, a projection part that protrudes from the device mounted part, and a probe arranged in the projection part. The probe is connected to the semiconductor device via a high-frequency transmission line. The width of the projection part is narrower than the width of the device mounted part.

A semiconductor package according to a third exemplary aspect of the present invention includes a probe, and a semiconductor device that receives a high-frequency signal from a waveguide via the probe or a high-frequency signal to the waveguide. The probe protrudes into a hollow tube that constitutes the waveguide, and constitutes a dielectric that covers the probe in such a way that, when the hollow tube is divided into a first space and a second space by a plane including the probe that protrudes into the hollow tube, the first space and the second space are coupled together.

Advantageous Effects of Invention

According to the present invention, it is possible to provide a semiconductor package and a semiconductor package mounting structure having good transmission properties of high-frequency signals.

DESCRIPTION OF EMBODIMENTS (First Exemplary Embodiment)

Hereinafter, with reference to the drawings, exemplary embodiments of the present invention will be described.

Figure 1:
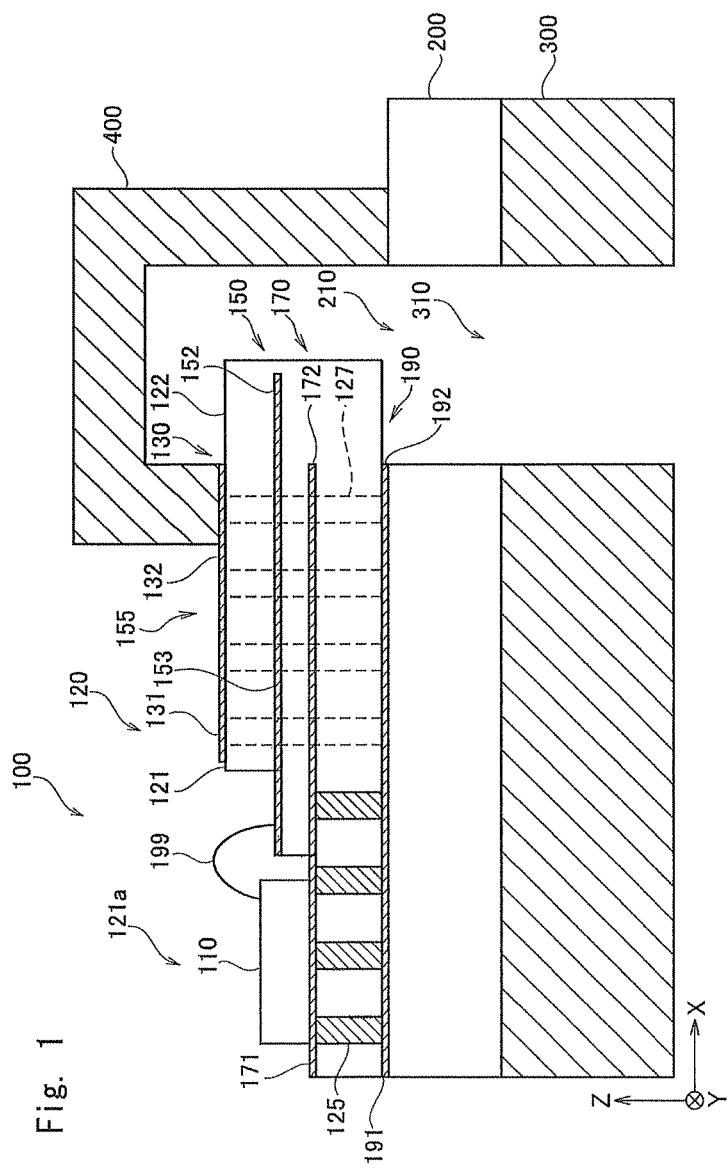
FIG. 1 is a partially cross-sectional view of a semiconductor package mounting structure according to a first exemplary embodiment.

FIG. 1 shows a partially cross-sectional view of a semiconductor package mounting structure according to a first exemplary embodiment.

The semiconductor package mounting structure according to the first exemplary embodiment is suitable to deal with high-frequency signals such as millimeter wave signals. The semiconductor package mounting structure according to the first exemplary embodiment is, for example, a millimeter wave transmitter, a millimeter wave up converter, or a millimeter wave down converter.

The semiconductor package mounting structure according to the first exemplary embodiment includes a semiconductor package 100, a printed board 200, a metal case 300, and a conductor cover 400. Here, an X direction, a Y direction, and a Z direction that are perpendicular to one another with respect to the semiconductor package mounting structure are defined. The Z direction corresponds to the thickness direction of the printed board 200. The semiconductor package 100 includes a semiconductor device 110, a multi-layered substrate 120, and a CAP (not shown). The semiconductor device 110 is arranged in a cavity 121a formed in the multi-layered substrate 120 and the CAP (not shown) seals the cavity 121a. The printed board 200 includes a front surface and a back surface which is the side opposite to the front surface. The semiconductor package 100 is mounted on the front surface of the printed board 200 and the metal case 300 is attached to the back surface of the printed board 200. A waveguide 310 is formed in the metal case 300. An opening 210 connected to a cavity of the waveguide 310 is formed in the printed board 200. The opening 210 is, for example, a rectangular through hole. The opening 210 may be referred to as a long through hole. The conductor cover 400 is attached to the front surface of the printed board 200 so as to cover the opening 210 and at least a part of the multi-layered substrate 120. The conductor cover 400 is provided to short-circuit the waveguide 310. In other words, the conductor cover 400 provides a back short of the waveguide 310.

The multi-layered substrate 120 includes a probe 152. The probe 152 is connected to the semiconductor device 110 through a high-frequency transmission line 155. The opening 210 includes a part that overlaps the probe 152 and a part that does not overlap the semiconductor package 100 when seen from the Z direction. Since the opening 210 includes the part that overlaps the probe 152, an interface to transmit high-frequency signals is formed between the high-frequency transmission line 155 and the waveguide 310. Since the opening 210 includes the part that does not overlap the semiconductor package 100, the opening 210 connected to the cavity of the waveguide 310 is not blocked by the dielectric included in the semiconductor package 100. Accordingly, even when the relative dielectric constant of the dielectric is large, a discontinuous point is hardly formed in the transmission line of high-frequency signals. Therefore, the semiconductor package mounting structure according to the first exemplary embodiment has good transmission properties of high-frequency signals.

In an another point of view, in the semiconductor package mounting structure according to the first exemplary embodiment, the waveguide 310 of the metal case 300, the opening 210 of the printed board 200, the metal cover 400, and a part of the multi-layered substrate 120 constitute a hollow tubular waveguide. The semiconductor device 110 receives high-frequency signals from this waveguide via the probe 152 or outputs high-frequency signals to the waveguide. The probe 152 protrudes into the hollow tube that constitutes the waveguide. A projection part 122 of the multi-layered substrate 120 which is a dielectric that covers the probe 152 is formed in such a way that, when the hollow tube is divided into a first space and a second space by the plane including the probe 152 that protrudes into the hollow tube (e.g., plane perpendicular to the Z direction), the first space and the second space are coupled together. In other words, the projection part 122 which is a dielectric that covers the probe 152 has such a shape that a gap is formed in the hollow tube. Accordingly, even when the relative dielectric constant of the dielectric is large, a discontinuous point is hardly formed in the transmission line of the high-frequency signals. Accordingly, the semiconductor package mounting structure according to the first exemplary embodiment has excellent transmission properties of the high-frequency signals.

Hereinafter, a semiconductor package mounting structure according to the first exemplary embodiment will be described in detail.

With reference to FIG. 1, the multi-layered substrate 120 is formed as a ceramic multi-layered substrate. The laminated direction of the multi-layered substrate corresponds to the Z direction. The multi-layered substrate 120 includes a device mounted part 121 on which the semiconductor device 110 is mounted and a projection part 122 that protrudes in the X direction from the device mounted part 110 to the opening 210. The cavity 121a is formed in the device mounted part 121. The cavity 121a has a two-stage structure.

The multi-layered substrate 120 includes metal pattern layers 130, 150, 170, and 190 and through holes 125 and 127. The metal pattern layer 190 is used to mount the semiconductor package 100 on the printed board 200 by a surface mount technology. The metal pattern layer 170 is arranged farther from the printed board 200 compared to the metal pattern layer 190. The metal pattern layer 150 is arranged farther from the printed board 200 compared to the metal pattern layer 170. The metal pattern layer 130 is arranged farther from the printed board 200 compared to the metal pattern layer 150.

The metal pattern layer 190 includes a ground pattern main part 191 arranged in the device mounted part 121 and a ground pattern projection part 192 arranged in the projection part 122. The ground pattern projection part 192 is projected in the X direction from the ground pattern main part 191. The metal pattern layer 170 includes a ground pattern main part 171 arranged in the device mounted part 121 and a ground pattern projection part 172 arranged in the projection part 122. The ground pattern projection part 172 is projected in the X direction from the ground pattern main part 171. The ground pattern main part 171 is arranged at the bottom of the cavity 121a. The semiconductor device 110 is mounted on the ground pattern main part 171. The metal pattern layer 150 includes the probe 152 arranged in the projection part 122 and a signal line pattern 153. The signal line pattern 153 includes a part arranged in the cavity 121a and a part arranged in the projection part 122. The probe 152 is connected to the semiconductor device 110 through the signal line pattern 153 and a bonding wire 199. The metal pattern layer 130 includes a ground pattern frame shape part 131 arranged in the device mounted part 121 and a ground pattern projection part 132 arranged in the projection part 122. The ground pattern projection part 132 is projected in the X direction from the ground pattern frame shape part 131. The ground pattern frame shape part 131 surrounds the cavity 121a.

The through holes 125 connect the ground pattern main part 171 and the ground pattern main part 191 each other. A set of through holes 127 connect the ground pattern frame shape part 131, the ground pattern main part 171, and the ground pattern main part 191 one another. The other set of through holes 127 connect the ground pattern projection parts 132, 172, and 192 one another. The signal line pattern 153 is disposed between the ground pattern projection parts 132 and 172. The ground pattern projection part 132, the signal line pattern 153, and the ground pattern projection part 172 form a high-frequency transmission line 155. The high-frequency transmission line 155 has a stripline structure.

The conductor cover 400 is attached to the surface of the printed board 200 to cover the opening 210 and at least a part of the projection part 122. The metal case 300 is attached to the back surface of the printed board 200 so that the cavity of the waveguide 310 overlaps the opening 210 when seen from the Z direction.

Figure 2:
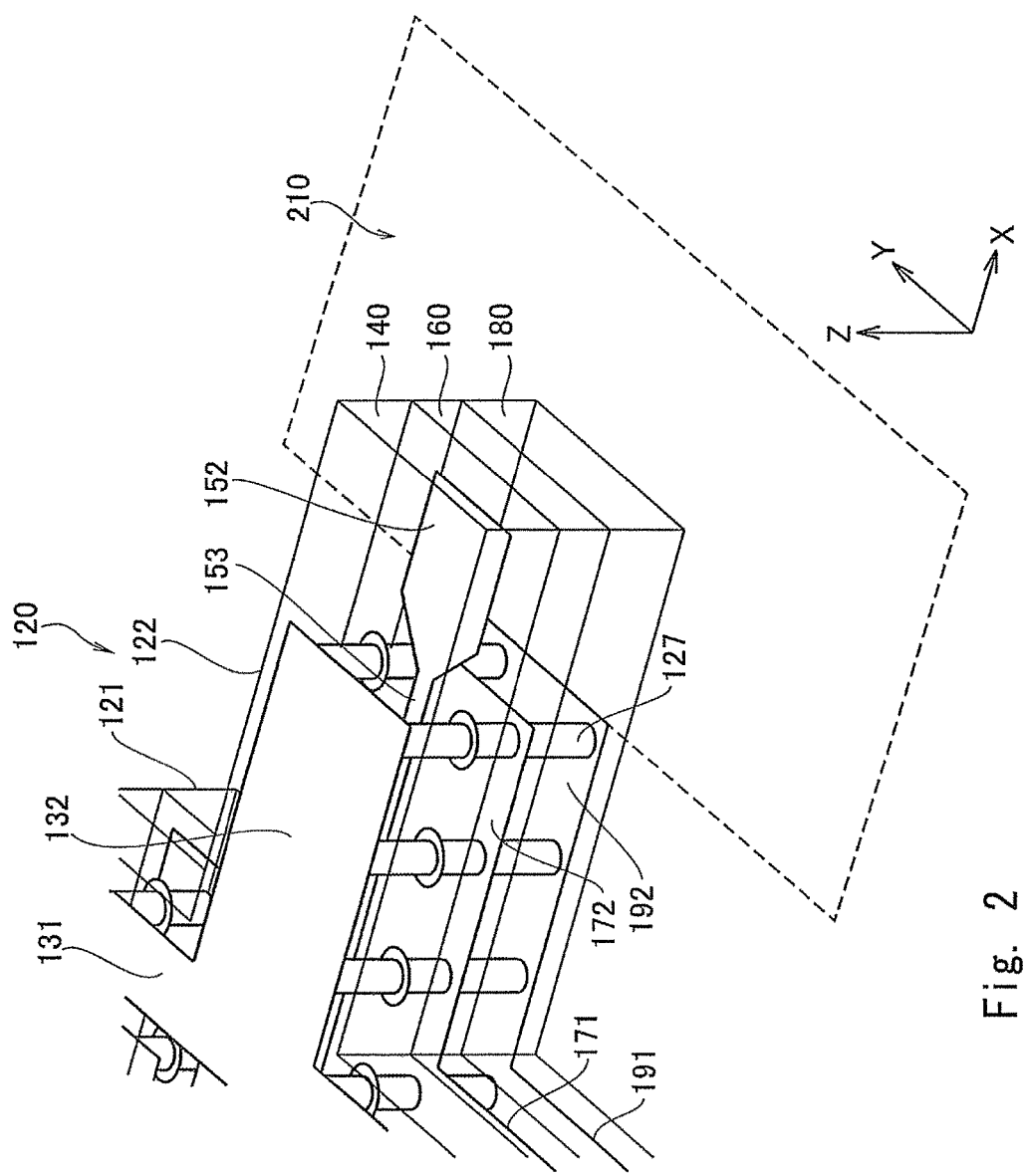
FIG. 2 is a perspective view showing an internal structure of a multi-layered structure included in the semiconductor package according to the first exemplary embodiment.

FIG. 2 shows an internal structure of the multi-layered substrate 120 around the projection part 122. The multi-layered substrate 120 includes dielectric layers 140, 160, and 180. In FIG. 2, in order to show the internal structure, the dielectric layers 140, 160, and 180 are shown to be transparent. The dielectric layers 140, 160, and 180 are, for example, low temperature calcined alumina ceramic substrates. The dielectric layer 180 is disposed between the metal pattern layer 190 and the metal pattern layer 170. The dielectric layer 160 is disposed between the metal pattern layer 170 and the metal pattern layer 150. The dielectric layer 140 is disposed between the metal pattern layer 150 and the metal pattern layer 130. The projection part 122 of the multi-layered substrate 120 is projected in the X direction from the device mounted part 121 toward the opening 210. The tip part of the projection part 122 (part in which the probe 152 is disposed) is disposed at a position that overlaps the opening 210. The ground pattern projection parts 132, 172, and 192 are not disposed at a position that overlaps the opening 210. The signal line pattern 153 is disposed between the ground pattern projection parts 132 and 172. The probe 152 is disposed at a position that overlaps the opening 210, not between the ground pattern projection parts 132 and 172. The signal line pattern 153 is parallel to the X direction. The signal line pattern 153 is held between a first through hole group and a second through hole group. The first through hole group include a plurality of through holes 127 arranged parallel to the X direction. The second through hole group includes a plurality of through holes 127 arranged parallel to the X direction.

In general, in a semiconductor package that deals with high-frequency signals such as millimeter wave signals, dimensions such as the thickness, the size of the electrode, the pitch of the through holes are close to those of the signal wavelength. Therefore, higher-order modes are generated in a signal propagation path and an input and an output of signals are prone to be obstructed. Since the signal line pattern 152 and the ground pattern projection parts 132 and 172 which are above and below the signal line pattern 152 do not include the discontinuous structure, there is no case in which the higher-order modes are generated. As described above, the ground pattern projection parts 132 and 172 are connected each other by the first through hole group and the second through hole group. Therefore, it is possible to prevent the leakage of the electromagnetic field. The semiconductor package 100 according to the first exemplary embodiment can be connected to the waveguide 310 in a state in which the semiconductor package 100 is mounted on the printed board 200 by a surface mount, whereby it is possible to suppress signal degradation due to the influence of the higher-order modes.

Figure 3:
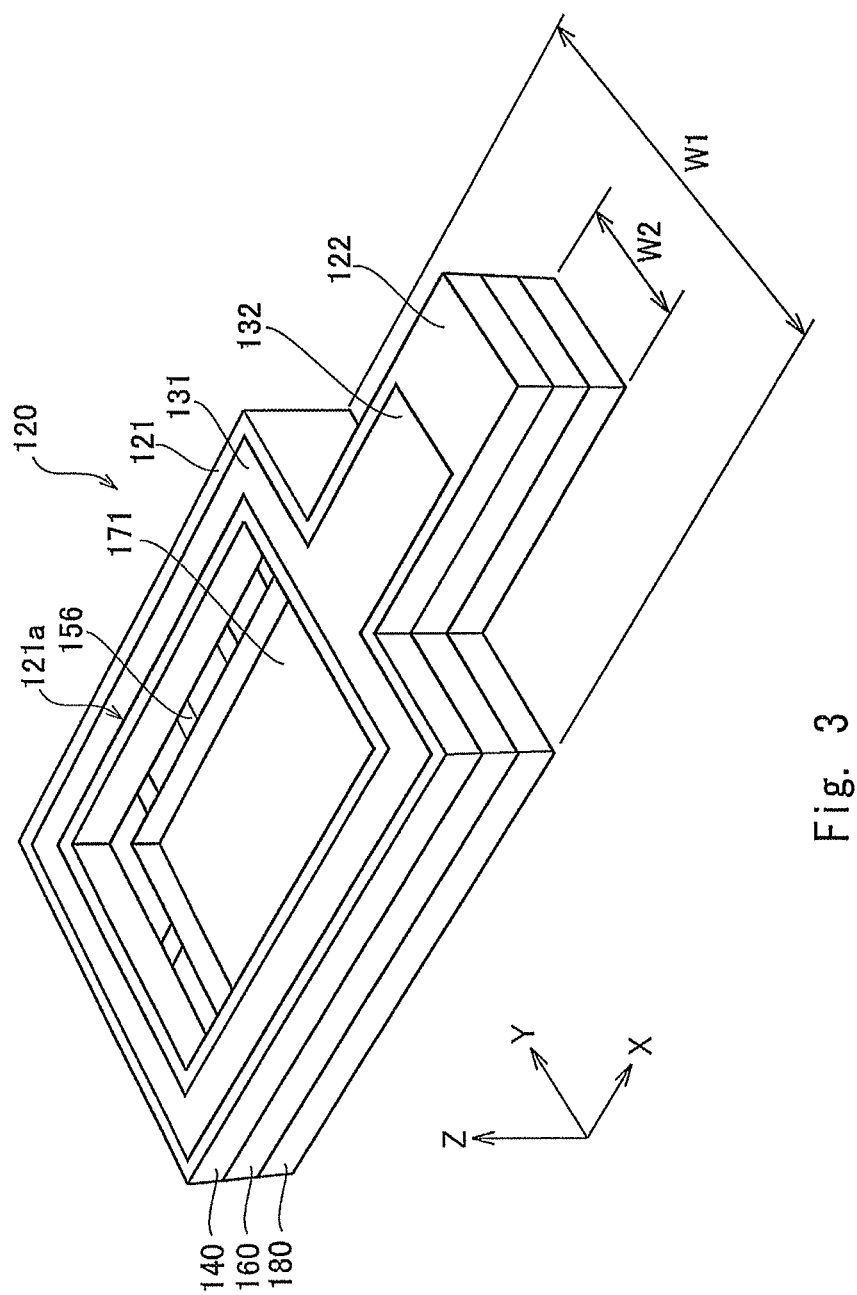
FIG. 3 is a perspective view of the multi-layered structure according to the first exemplary embodiment.
Figure 4A:
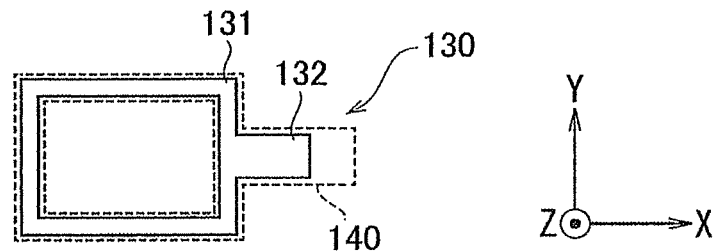
FIG. 4A is a plane view of a metal pattern layer included in the multi-layered structure according to the first exemplary embodiment.
Figure 4B:
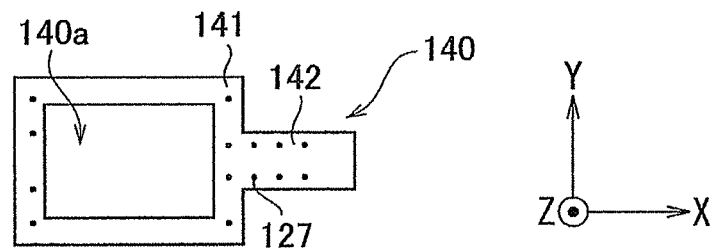
FIG. 4B is a plane view of a dielectric layer included in the multi-layered structure according to the first exemplary embodiment.
Figure 4C:
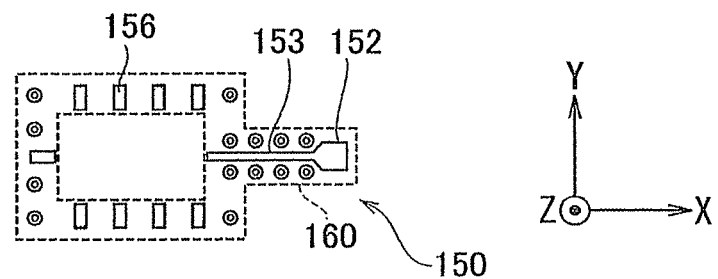
FIG. 4C is a plane view of a metal pattern layer included in the multi-layered structure according to the first exemplary embodiment.
Figure 4D:
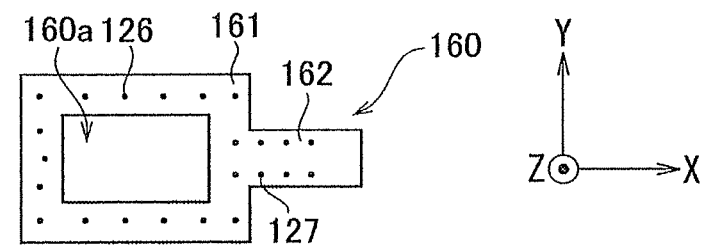
FIG. 4D is a plane view of a dielectric layer included in the multi-layered structure according to the first exemplary embodiment.
Figure 4E:
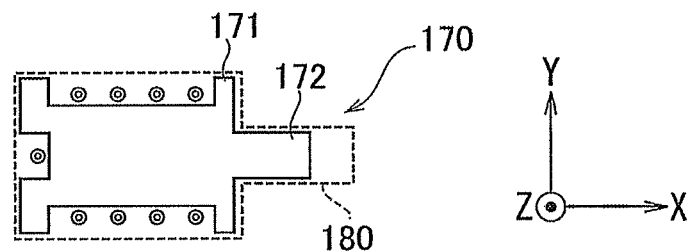
FIG. 4E is a plane view of a metal pattern layer included in the multi-layered structure according to the first exemplary embodiment.
Figure 4F:
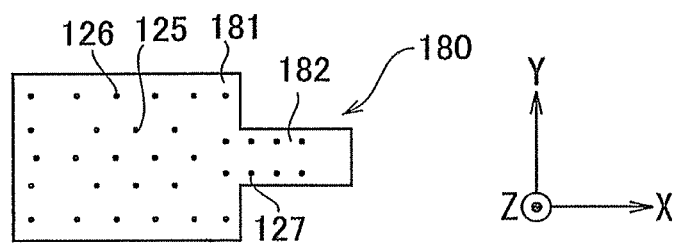
FIG. 4F is a plane view of a dielectric layer included in the multi-layered structure according to the first exemplary embodiment.
Figure 4G:
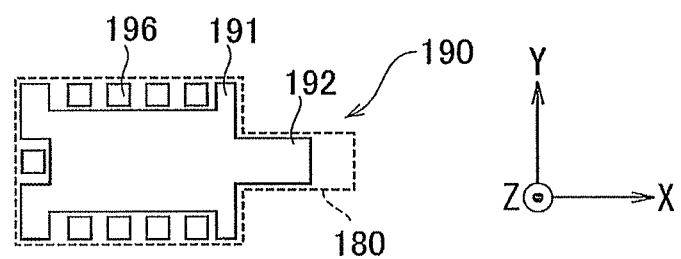
FIG. 4G is a plane view of a metal pattern layer included in the multi-layered structure according to the first exemplary embodiment.

With reference to FIG. 3, the cavity 121a in which the semiconductor device 110 is arranged and the device mounted part 121 in which the cavity 121a is formed each have a rectangle shape. A width W2 of the projection part 122 in the Y direction is narrower than a width W1 of the device mounted part 121 in the Y direction. There is a limit for reduction in the width W1 of the device mounted part 121 on which the semiconductor device 110 is mounted. By disposing the probe 152 in the projection part 122 of the narrow width W2, the size of the dielectric arranged in the upper space of the opening 210 can be reduced. By making the width W2 of the projection part 122 narrower than the width W1 of the device mounted part 121, the transmission properties of the high-frequency signals are further improved. Incidentally, the metal pattern layer 150 includes an electrode pattern 156 disposed in the cavity 121a. The electrode pattern 156 is connected to the semiconductor device 110 through a bonding wire (not shown).

With reference to FIGS. 4A to 4G, the metal pattern layers 130, 150, 170, and 190, and the dielectric layers 140, 160, and 180 will be described. The metal pattern layer 130 includes a ground pattern frame shape part 131 and a ground pattern projection part 132 that is projected in the X direction from the ground pattern frame shape part 131. The metal pattern layer 130 is formed on the dielectric layer 140 by, for example, calcination. The dielectric layer 140 includes a dielectric frame shape part 141 that surrounds a rectangle opening part 140a and a dielectric projection part 142 that is projected in the X direction from the dielectric frame shape part 141. The metal pattern layer 150 includes a probe 152, a signal line pattern 153, and an electrode pattern 156. The metal pattern layer 150 is formed on the dielectric layer 160 by, for example, calcination. The dielectric layer 160 includes a dielectric frame shape part 161 that surrounds a rectangle opening part 160a and a dielectric projection part 162 that is projected in the X direction from the dielectric frame shape part 161. Since the cavity 121a has a two-stage structure, the opening part 160a is smaller than the opening part 140a. The metal pattern layer 170 includes a ground pattern main part 171 and a ground pattern projection part 172 that is projected in the X direction from the ground pattern main part 171. The metal pattern layer 170 is formed on the dielectric layer 180 by, for example, calcination. The dielectric layer 180 includes a dielectric rectangle part 181 and a dielectric projection part 182 that is projected in the X direction from the dielectric rectangle part 181. The metal pattern layer 190 includes a ground pattern main part 191, a ground pattern projection part 192 that is projected in the X direction from the ground pattern main part 191, and an electrode pattern 196. The electrode pattern 196 is, for example, an electrode pattern to apply a DC bias to a circuit in the semiconductor device 110. The electrode pattern 196 may be an electrode pattern for low-frequency signals (e.g., LO signals or IF signals for an up converter or a down converter). The metal pattern layer 190 is formed directly below the dielectric layer 180 by, for example, calcination. The ground pattern frame shape part 131, the dielectric frame shape part 141, a part of the signal line pattern 153, the electrode pattern 156, the dielectric frame shape part 161, the ground pattern main part 171, the dielectric rectangle part 181, the ground pattern main part 191, and the electrode pattern 196 are arranged in the device mounted part 121 of the multi-layered substrate 120. The ground pattern projection part 132, the dielectric projection part 142, the probe 152, another part of the signal line pattern 153, the dielectric projection part 162, the ground pattern projection part 172, the dielectric projection part 182, and the ground pattern projection part 192 are arranged in the projection part 122 of the multi-layered substrate 120. The metal pattern layers 130, 150, 170, and 190 may be formed by other methods than calcination. The metal pattern layer 150 may be formed in the dielectric layer 140. The metal pattern layer 170 may be formed in the dielectric layer 160.

The multi-layered substrate 120 includes, in addition to the above through holes 125 and 127, a through hole 126. The through hole 125 penetrates through the dielectric rectangle part 181 and connects the ground pattern main parts 171 and 191. The through hole 126 penetrates through the dielectric frame shape part 161 and the dielectric rectangle part 181 and connects the electrode patterns 156 and 196. A set of through holes 127 penetrate through the dielectric frame shape part 141, the dielectric frame shape part 161, and the dielectric rectangle part 181 and connect the ground pattern frame shape part 131, the ground pattern main part 171, and the ground pattern main part 191. The other set of through holes 127 penetrate through the dielectric projection parts 142, 162, and 182 and connect the ground pattern projection parts 132, 172, and 192. The through holes 125 to 127 are formed, for example, as hollow or solid conductors that extend in the Z direction.

Figure 5:
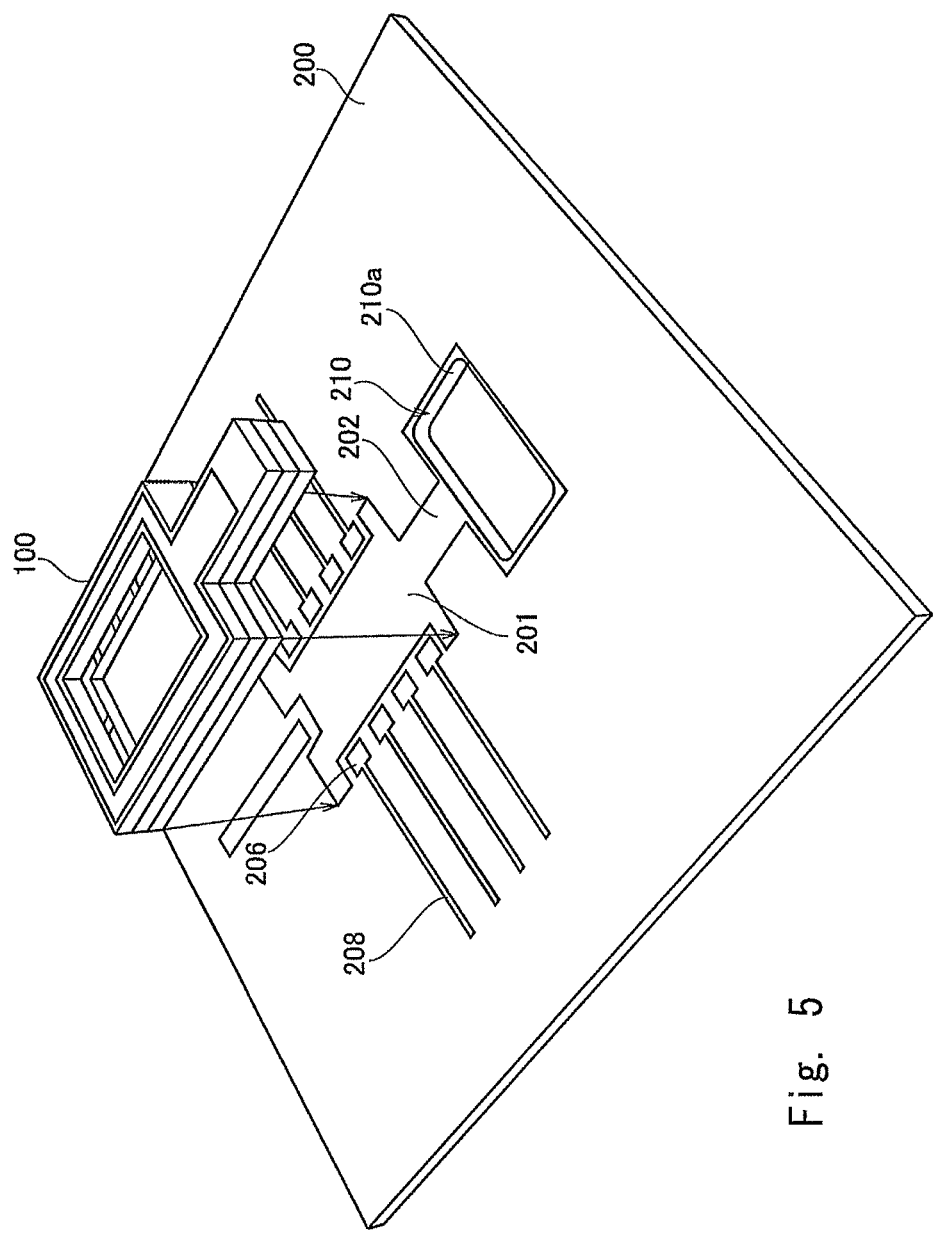
FIG. 5 is a perspective view showing a process in which the semiconductor package according to the first exemplary embodiment is mounted on a printed board.

With reference to FIG. 5, metal patterns 201, 202, and 206 to mount the semiconductor package 100 on the printed board 200, and a wiring pattern 208 are formed on the surface of the printed board 200. The metal pattern 201 is connected to a conducting wall 210*a* of the opening 210 via the metal pattern 202. Note that the metal patterns 201 and 202 form a ground plane. The metal pattern 206 forms an electrode pattern separated from the metal patterns 201 and 202. The wiring pattern 208 is connected to the metal pattern 206. In FIG. 5, the CAP and the semiconductor device 110 of the semiconductor package 100 are omitted. The metal patterns 201, 202, and 206 of the printed board 200 and the ground pattern main part 191, the ground pattern projection part 192, and the electrode pattern 196 of the semiconductor package 100 are used to mount the semiconductor package 100 on the printed board 200 by a surface mount technology. The semiconductor package 100 is mounted on the printed board 200 by soldering. When the semiconductor package 100 is mounted on the printed board, the ground pattern main part 191 is arranged on the metal pattern 201, the ground pattern projection part 192 is arranged on the metal pattern 202, and the electrode pattern 196 is arranged on the metal pattern 206. The metal pattern layer 190 which is the lowermost layer of the semiconductor package 100 produces the effects of self alignment when the semiconductor package 100 is mounted on the printed board 200. Accordingly, the accuracy of the position in which the semiconductor package 100 is mounted is improved. At least a part of the wiring pattern 208 is not arranged below the semiconductor package 100 that is mounted on the printed board 200.

Figure 6:
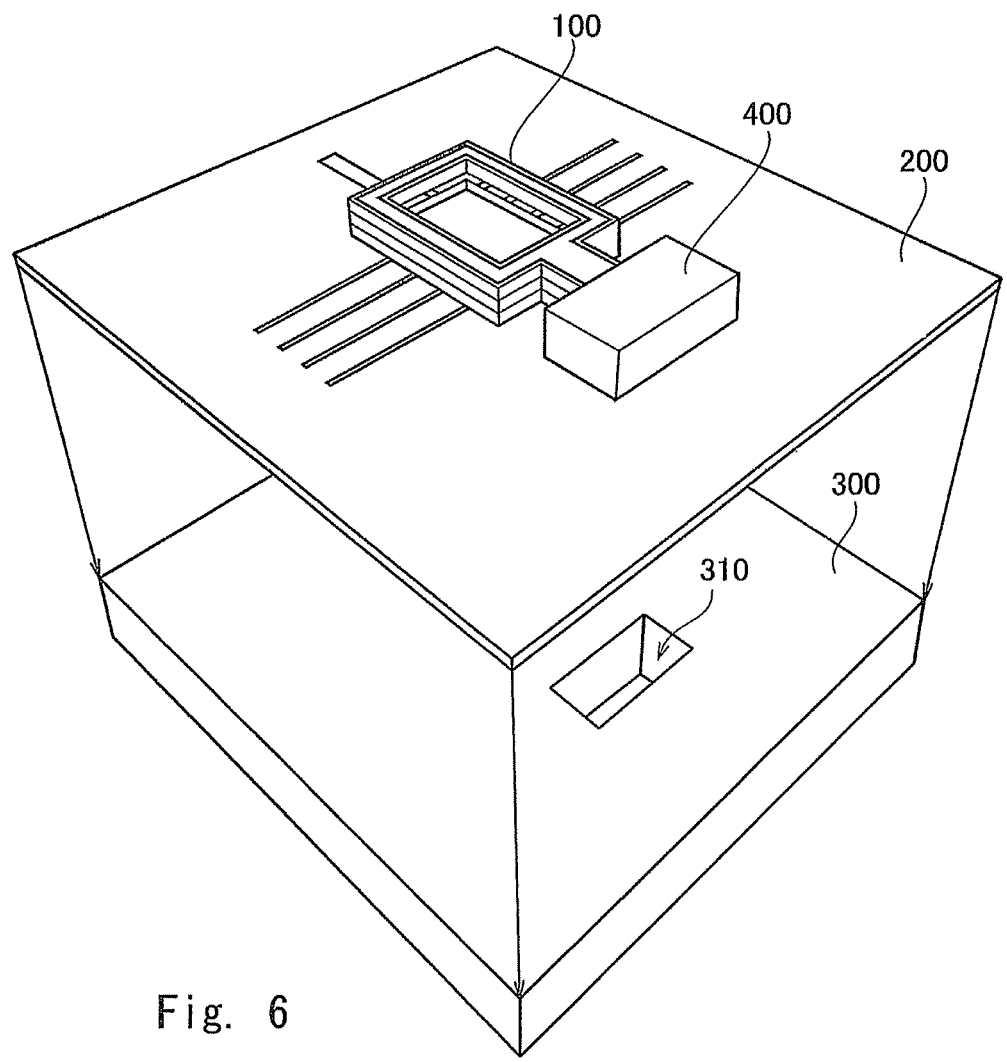
FIG. 6 is a perspective view showing a process in which the printed board according to the first exemplary embodiment is attached to a case.

With reference to FIG. 6, the conductor cover 400 is attached to the surface of the printed board 200 so as to cover the opening 210 and at least a part of the projection part 212 of the semiconductor package 100. The metal case 300 is attached to the back surface of the printed board 200 so that the waveguide 310 and the opening 210 overlap each other.

Figure 7:
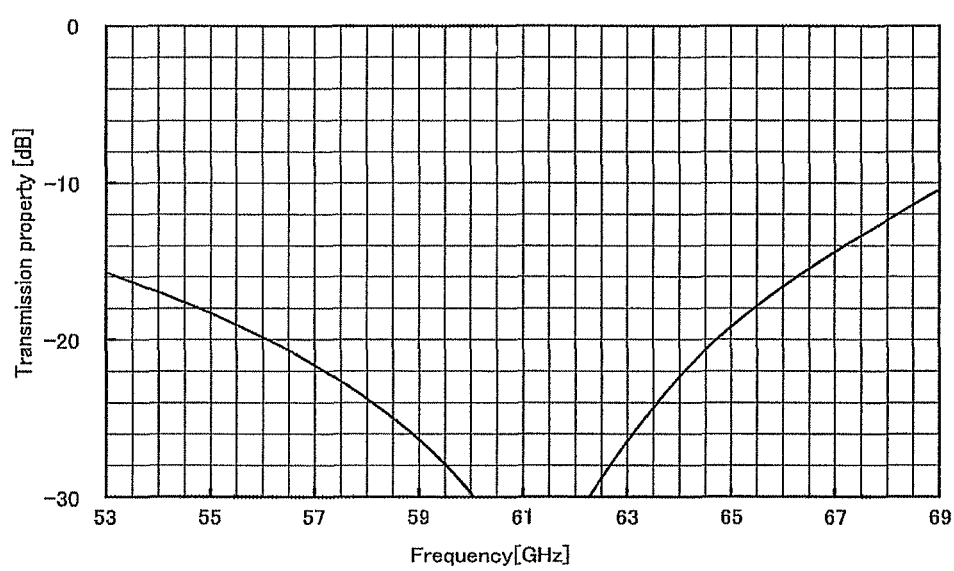
FIG. 7 is a graph of signal transmission properties in a projection part of the semiconductor package according to the first exemplary embodiment.

FIG. 7 shows results in which signal transmission properties by a three-dimensional electromagnetic field analysis are simulated for the projection part 212 of the semiconductor package 100. The vertical axis in FIG. 7 shows signal transmission properties and the horizontal axis in FIG. 7 shows a signal frequency. The simulations of a case in which the dielectric layers 140, 160, and 180 are formed of low temperature calcination alumina ceramic with the relative dielectric constant of 7.0 were carried out. By appropriately setting the dimension conditions, good signal transmission properties were obtained at the band of 60 GHz. In general, when the relative dielectric constant of the part of the dielectric arranged in the waveguide is significantly deviated from 1, a discontinuous point is formed in the signal transmission line, which degrades the signal transmission properties. When the signal frequency is high, in particular, the signal transmission properties are further degraded. According to the first exemplary embodiment, it is possible to decrease the size of the part of the semiconductor package 100 that protrudes into the upper space of the waveguide 310. It is therefore possible to improve the transmission properties of high-frequency signals.

Further, the semiconductor package 100 according to the first exemplary embodiment can be connected to the waveguide 310 in a state in which the semiconductor package 100 is mounted on the printed board 200 by a surface mount, whereby it is possible to suppress signal degradation due to the influence of the higher-order modes.

(Second Exemplary Embodiment)

While the semiconductor package mounting structure according to the above first exemplary embodiment is the semiconductor package mounting structure having one port of a millimeter wave interface, a semiconductor package mounting structure according to a second exemplary embodiment is a semiconductor package mounting structure having two ports of a millimeter wave interface. In the second exemplary embodiment, a projection part 122 is provided on both sides of the device mounted part 121.

Note that the above exemplary embodiments may be changed as appropriate without departing from the spirit of the present invention. For example, the number of metal pattern layers included in the multi-layered substrate 120 is not limited to four. Besides the four metal pattern layers 130, 150, 170, and 190, other metal pattern layers may be added. When the high-frequency transmission line 155 is formed to have a microstripline structure, not a stripline structure, the number of metal pattern layers that are included in the multi-layered substrate 120 may be set to three. The cavity 121*a* in which the semiconductor device 110 is arranged is not limited to the two-stage structure and may be a structure having three or more stages. The multi-layered substrate 120 is not limited to the ceramic substrate. The dielectric layers 140, 160, and 180 may be formed of an organic material in place of the ceramic material. A board other than the printed board may be used in place of the printed board 200.

While the present invention has been described with reference to the exemplary embodiments, the present invention is not limited to the above exemplary embodiments. Various changes that can be understood by those skilled in the art can be made to the configuration and the details of the present invention within the scope of the present invention.

This application is based upon and claims the benefit of priority from Japanese Patent Application No. 2012-242580, filed on Nov. 2, 2012, the disclosure of which is incorporated herein in its entirety by reference.

REFERENCE SIGNS LIST

100 SEMICONDUCTOR PACKAGE
110 SEMICONDUCTOR DEVICE
120 MULTI-LAYERED SUBSTRATE
121 DEVICE MOUNTED PART
121*a* CAVITY
122 PROJECTION PART
130, 150, 170, 190 METAL PATTERN LAYERS
132 GROUND PATTERN PROJECTION PART
152 PROBE
153 SIGNAL LINE PATTERN
155 HIGH-FREQUENCY TRANSMISSION LINE
156 ELECTRODE PATTERN
171 GROUND PATTERN MAIN PART
172 GROUND PATTERN PROJECTION PART
196 ELECTRODE PATTERN
200 PRINTED BOARD
210 OPENING
300 METAL CASE
310 WAVEGUIDE
400 CONDUCTOR COVER
W1, W2 WIDTHS

The invention claimed is:

1. A semiconductor package mounting structure comprising:
    a substrate in which an opening connected to a cavity of a waveguide is formed; and
    a semiconductor package mounted on the substrate, wherein:
    the semiconductor package comprises:
        a semiconductor device;
        a probe connected to the semiconductor device; and
        a multi-layered substrate comprising first to fourth metal pattern layers,
    the opening comprises:
        a part that overlaps the probe; and
        a part that does not overlap the semiconductor package,
    the multi-layered substrate comprises:
        a device mounted part on which the semiconductor device is mounted, wherein the semiconductor device is arranged in a cavity formed in the device mounted part; and
        a projection part that projects from the device mounted part to the opening, the probe being disposed in the projection part,
    wherein:
        the first metal pattern layer comprises a first layer ground pattern arranged in the projection part,
        the second metal pattern layer comprises the probe and a line pattern,
        the probe is connected to the semiconductor device via the line pattern,
        the third metal pattern layer includes a third layer first ground pattern arranged at a bottom of the cavity and a third layer second ground pattern arranged in the projection part,
        the semiconductor device is mounted on the third layer first ground pattern, and
        the first layer ground pattern, the line pattern, and the third layer second ground pattern form a stripline structure.

2. The semiconductor package mounting structure according to claim 1, wherein the width of the projection part is narrower than the width of the device mounted part.

3. The semiconductor package mounting structure according to claim 2, further comprising:
    a conductor cover to short-circuit the waveguide; and
    a metal case in which the waveguide is formed, wherein:
    the substrate includes a front surface on which the semiconductor package is mounted and a back surface which is a side opposite to the front surface,
    the conductor cover is attached to the front surface so as to cover the opening and at least a part of the projection part,
    the metal case is attached to the back surface so that the cavity of the waveguide overlaps the opening,
    the fourth metal pattern layer comprises a fourth layer electrode pattern to mount the semiconductor package on the substrate by a surface mount technology,
    the third metal pattern layer is arranged farther from the substrate compared to the fourth metal pattern layer,
    the second metal pattern layer is arranged farther from the substrate compared to the third metal pattern layer,
    the first metal pattern layer is arranged farther from the substrate compared to the second metal pattern layer,
    the second metal pattern layer further comprises a second layer electrode pattern connected to the semiconductor device,
    the second layer electrode pattern is arranged in the cavity, and
    the line pattern includes a part arranged in the cavity and a part arranged in the projection part.

\* \* \* \* \*